United States Patent
Cerrina et al.

(10) Patent No.: US 8,815,575 B2
(45) Date of Patent: Aug. 26, 2014

(54) STEPPING OPTICAL REDUCTION SYSTEM

(75) Inventors: Franco Cerrina, Madison, WI (US); Omar Negrete, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 1667 days.

(21) Appl. No.: 11/859,404

(22) Filed: Sep. 21, 2007

(65) Prior Publication Data
US 2009/0080053 A1 Mar. 26, 2009

(51) Int. Cl.
G02F 1/01 (2006.01)
G02F 1/00 (2006.01)

(52) U.S. Cl.
USPC .................. 435/287.2; 435/287.1; 435/283.1

(58) Field of Classification Search
CPC ..................................... G02F 1/00; G02F 1/01
USPC ....................................................... 435/287.2
See application file for complete search history.

(56) References Cited

U.S. PATENT DOCUMENTS

| 4,841,341 | A * | 6/1989 | Ogawa et al. ................... 355/43 |
| 6,281,655 | B1 * | 8/2001 | Poon et al. ................... 318/649 |
| 6,437,463 | B1 * | 8/2002 | Hazelton et al. ........... 310/12.06 |
| 2002/0012100 | A1 * | 1/2002 | Shafer ............................. 353/30 |
| 2003/0190536 | A1 * | 10/2003 | Fries ............................... 430/22 |
| 2004/0126757 | A1 * | 7/2004 | Cerrina ............................. 435/6 |
| 2005/0200827 | A1 | 9/2005 | Tanaka |
| 2005/0249396 | A1 | 11/2005 | Cerrina et al. |
| 2007/0183943 | A1 | 8/2007 | Golovkina et al. |

FOREIGN PATENT DOCUMENTS

EP 0267766 5/1988

OTHER PUBLICATIONS

Singh-Gasson, S.; Green, R. D.; Yue, Y.; Nelson, C.; Blattner, F.; Sussman, M.R.; Cerrina, F. "Maskless fabrication of light-directed oligonucleotide microarrays using a digital micromirror array." Nature Biotechnology, 1999, vol. 17, pp. 974-978.*
International Preliminary Report on Patentability for PCT/US2008/076664, dated Apr. 1, 2010.
Invitation to Pay Additional Fees and, Where Applicable, Protest Fee and Annex to Form PCT/ISA/206 Communication Relating to the Results of the Partial International Search for PCT/US2008/076664 dated Apr. 3, 2009.
Huang, W. et al., "The con-focal method on verifying focal plane of MAS machine," Optics Express, vol. 15, No. 3, Feb. 5, 2007, pp. 872-877.

(Continued)

*Primary Examiner* — Christine T Mui
(74) *Attorney, Agent, or Firm* — Bell & Manning, LLC

(57) ABSTRACT

A device and a method for synthesizing a microarray are provided. The device includes a reduction optics assembly and a target assembly. The reduction optics assembly is configured to receive a light array of selectable regions of light and dark areas, to reduce a size of the light array in two-dimensions, and to project a pattern of the light array on a target surface. The target assembly includes a first stage and a second stage. The first stage is configured to move the target surface in at least two directions in plane with the projected pattern with a first precision. The second stage is mounted to the first stage and is configured to move the target surface in the at least two directions in plane with the projected pattern with a second precision that is smaller than the first precision.

13 Claims, 5 Drawing Sheets

(56) References Cited

OTHER PUBLICATIONS

Kessels, M. V. et al., "Versatile stepper based maskless microlithography using a liquid crystal display for direct write of binary and multilevel microstructures," *J. Micro/Nanolith, MEMS MOEMS*, vol. 6, No. 3, Jul. 2007, pp. 1-12.

Negrete, O. D. et al., "Step-and-scan maskless lithography for ultra large scale DNA chips," *Microelectronic Engineering*, Elsevier Publishers BV., Amsterdam, NL, vol. 85, No. 5-6, May 1, 2008, pp. 834-837.

Singh-Gasson, S. et al., "Maskless fabrication of light-directed oligonucleotide microarrays using a digital micromirror array," *Nature Biotechnology*, vol. 17, Oct. 1999, pp. 974-978.

PCT International Search Report and Written Opinion for PCT/US2008/076664 mailed Jun. 15, 2009.

Hudyma, R., "High NA Microstepper Final Optical Design Report", U.S. Department of Energy LLNL, Information Science & Technology Program Technical Report M199900286, Sep. 24, 1999.

Arnold, S., final summary report of the design work by SMA Optical Technologies, Inc., Oct. 29, 2006.

\* cited by examiner

STEPPING OPTICAL REDUCTION SYSTEM

STATEMENT OF GOVERNMENT RIGHTS

This invention was made with United States government support awarded by the following agencies: NIH HG003275. The United States has certain rights in this invention.

FIELD

The field of the disclosure relates generally to optical reduction systems. More specifically, the disclosure relates to a stepping system used in combination with an optical reduction system to synthesize ultra-high density DNA microarrays.

BACKGROUND

The advent of deoxyribonucleic acid (DNA) microarray, or DNA chip, technology makes it possible to build an array of hundreds of thousands of DNA sequences in a very small area. A maskless array synthesizer (MAS) instrument uses light to direct synthesis of the DNA sequences. The array probes (e.g., a combination of a universal primer, a sequence-specific probe, and optionally a calibrated probe sequence) are synthesized one nucleotide at a time in the common area of the microarray using the MAS instrument. Graphics files that describe the pattern of light used to synthesize the DNA sequences are used to create a series of virtual masks. The "virtual masks" are formed by digitally addressing a micromirror array using the graphics files in synchrony with the synthesis chemistry to synthesize the DNA chip. The widespread use of DNA microarray chips is still limited, however, by their relatively high cost. For large-scale studies, the cost per feature rather than the cost per chip is important. Therefore, what is needed is a system and a method that increase the number of features per chip to reduce the cost per feature.

SUMMARY

In an exemplary embodiment, a device is provided for forming a DNA microarray. The device includes a reduction optics assembly and a target assembly. The reduction optics assembly is configured to receive a light array of selectable regions of light and dark areas, to reduce a size of the light array in two-dimensions, and to project a pattern of the light array on a target surface. The target assembly includes a first stage and a second stage. The first stage is configured to move the target surface in at least two directions in plane with the projected pattern with a first precision. The second stage is mounted to the first stage and is configured to move the target surface in the at least two directions in plane with the projected pattern with a second precision that is smaller than the first precision.

In another exemplary embodiment, a method is provided for forming a DNA microarray. A substrate is provided with an active surface on which a microarray is formed. The method further includes the following operations:

(b) emitting a light array of selectable regions of light and dark areas from a light emitting object array;
(c) receiving the light array emitted from the light emitting object array at a first aspheric mirror;
(d) reflecting the received light array from the first aspheric mirror towards a second aspheric mirror;
(e) receiving the reflected light array from the first aspheric mirror at the second aspheric mirror;
(f) reflecting the received reflected light array from the second aspheric mirror towards the substrate;
(g) imaging a pattern formed by the light array onto a synthesis region of the active surface of the substrate, wherein a size of the pattern formed by the light array is reduced in two-dimensions;
(h) moving the substrate using a first stage to a second synthesis region using an actuator;
(i) moving the substrate using a second stage within the second synthesis region using an actuator to align the active surface with the first aspheric mirror and the second aspheric mirror; and
(j) repeating (b) to (g) to form a second image of the pattern formed by the light array onto the second synthesis region of the active surface of the substrate.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

DETAILED DESCRIPTION

Figure 1:
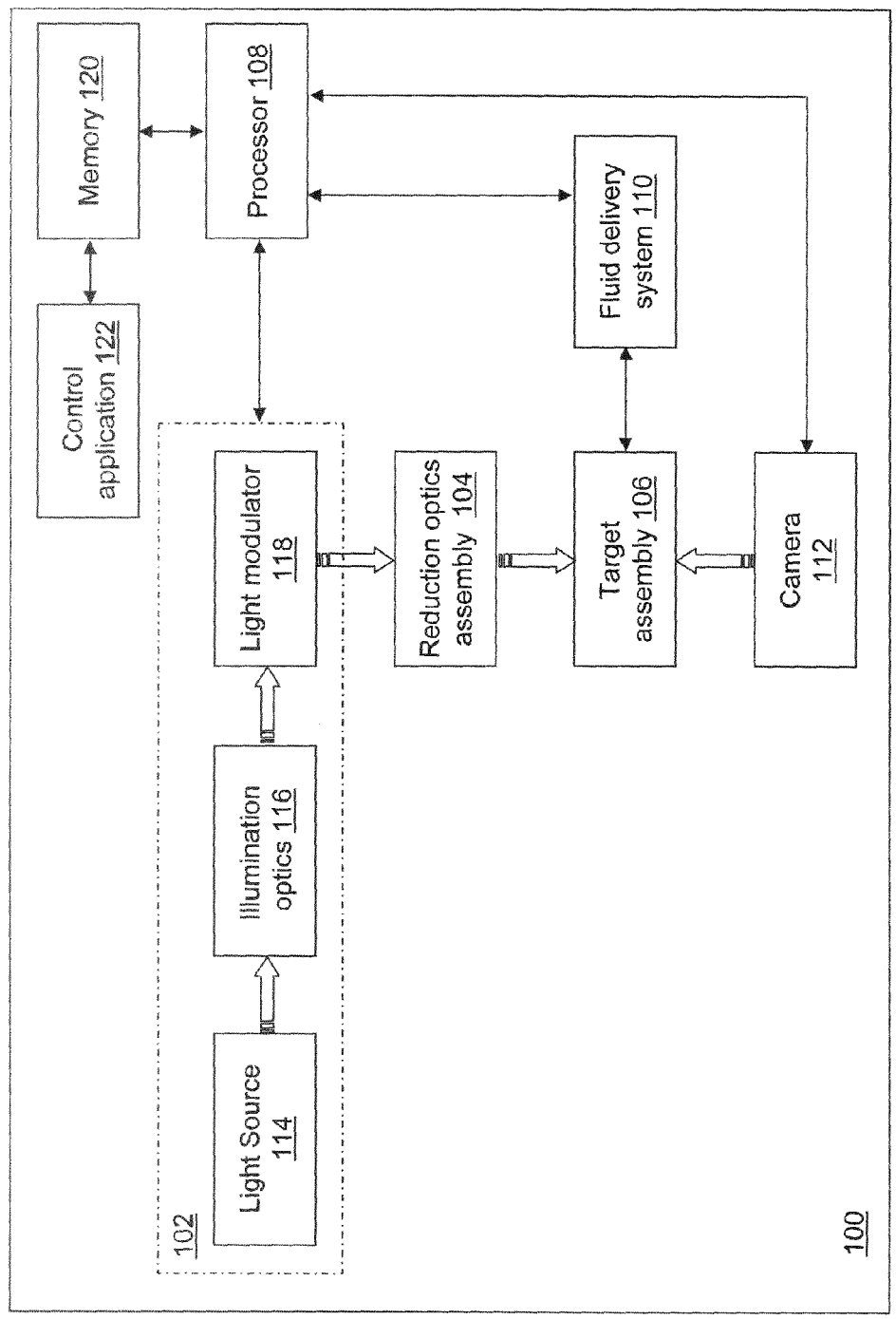
FIG. 1 is a block diagram illustrating the functional components of a system for synthesizing a DNA chip in accordance with an exemplary embodiment.

With reference to FIG. 1, a block diagram of a system 100 is shown in accordance with an exemplary embodiment. In an exemplary embodiment, system 100 synthesizes arrays of DNA molecules on a DNA chip. System 100 may include a light emitting object array 102, a reduction optics assembly 104, a target assembly 106, a processor 108, a fluid delivery system 110, a camera 112, a memory 120, and a control application 122. There may be fewer or additional components in system 100. Light emitting object array 102 may include a light source 114, illumination optics 116, and a light modulator 118. Light emitting object array 102 provides selectable regions of emitted light.

In an exemplary embodiment, a spectrum of light source 114 is selected to correspond with an absorption spectrum of photosensitive compounds for synthesizing arrays of DNA molecules on a DNA chip. For example, light source 114 may be an ultraviolet (UV) or near UV light source. Exemplary light sources for generating UV radiation include mercury (Hg) and Hg-Xenon (Xe) arc lamps, light emitting diodes, plasma sources, gas lasers (e.g., argon), and solid state lasers. For example, light source 114 may be a 200 watt Hg—Xe lamp. A filter may receive light from light source 114 and selectively pass only desired wavelengths. For example, the filter may only pass the 365 nanometer (nm) Hg line. Devices for filtering or monochromating a light source include, but are not limited to, diffraction gratings, dichroic mirrors, and prisms and are referred to herein as "filters". Light from light source 114 is focused into an entrance of illumination optics 116.

Figure 2:
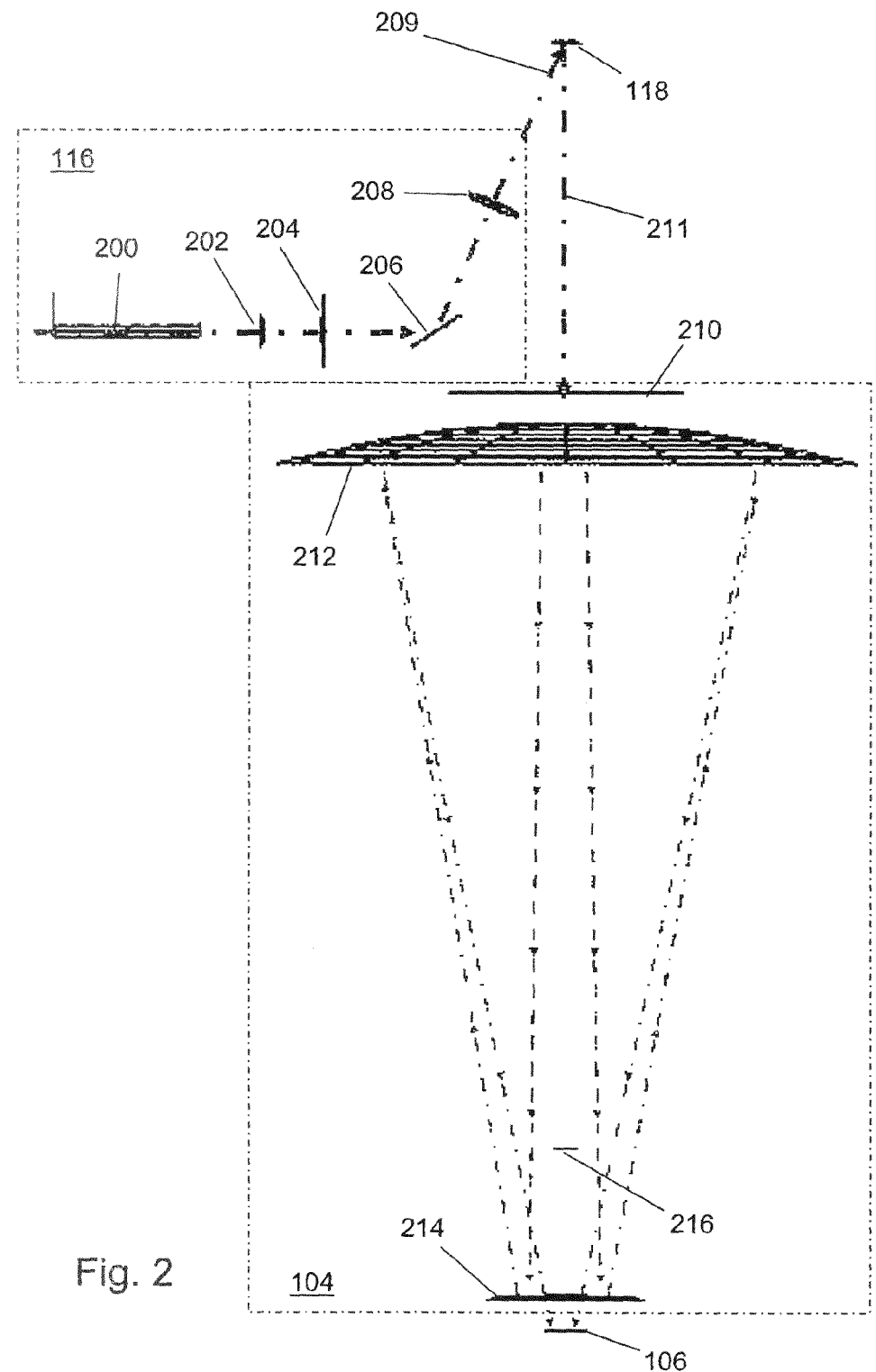
FIG. 2 is a simplified illustrative view of a reflective optical assembly included in the system of FIG. 1 in accordance with an exemplary embodiment.

With reference to FIG. 2, illumination optics 116 may include a condenser/collimator 200, a first lens 202, a shutter 204, a first mirror 206, and a second lens 208. Condenser/collimator 200 forms a collimated beam. Light from condenser/collimator 200 is imaged by a two-lens imaging system that includes first lens 202 and second lens 208. Light from first lens 202 is focused through shutter 204 and onto first mirror 206 which reflects the light at an angle toward second lens 208. Illumination optics 116 project a uniform distribution of light 209 onto light modulator 118.

Light modulator 118 receives light 209 and modulates light 209 into a light array 211 of light and dark areas that are projected toward reduction optics assembly 104. Light modulator 118 is controlled by processor 108 which provides commands to specify the pattern of light and dark areas. In an exemplary embodiment, light modulator 118 is a digital micro-mirror device (DMD). For example, a commercially available DMD manufactured by Texas Instruments, Inc. is a digital light processor extended graphics array (XGA) chip having 1024×768 pixels or a super XGA (SXGA) chip having 1280×1024 pixels. Other spatial light modulators include liquid crystal displays, arrays of micro-shutters, arrays of light emitting diodes, arrays of laser diodes, other micro-electromechanical devices, and in generals any optical, opto-mechanical or opto-chemical device capable of generating a modulated beam of light either in amplitude or phase. In an exemplary embodiment, light modulator 118 includes mirrors that are individually addressable and can be used to create any defined pattern or image in a broad range of wavelengths. The defined pattern may be created as a bitmap or other graphics file stored in memory 120 and accessible by processor 108. The defined pattern may be sent to a controller of light modulator 118, which forms the desired pattern.

With continuing reference to FIG. 1, memory 120 is an electronic holding place or storage for information so that the information can be accessed by processor 108 as known to those skilled in the art. System 100 may have one or more memories that use the same or a different memory technology. Memory technologies include, but are not limited to, any type of random access memory (RAM), any type of read only memory (ROM), any type of flash memory, etc. System 100 also may have one or more drives that support the loading of a memory media such as a compact disk (CD) or digital video disk (DVD) or ports that support connectivity with memory media such as flash drives.

Processor 108 executes instructions as known to those skilled in the art. The instructions may be carried out by a special purpose computer, logic circuits, or hardware circuits. Thus, processor 108 may be implemented in hardware, firmware, software, or any combination of these methods. The term "execution" is the process of running an application or the carrying out of the operation called for by an instruction. The instructions may be written using one or more programming language, scripting language, assembly language, etc. Processor 108 executes an instruction, meaning that it performs the operations called for by that instruction. Processor 108 operably couples with memory 120, with fluid delivery system 110, with light modulator 118, with camera 112, etc. to receive, to send, and to process information. Processor 108 may retrieve a set of instructions from a permanent memory device and copy the instructions in an executable form to a temporary memory device that is generally some form of RAM. System 100 may include a plurality of processors that use the same or a different processing technology.

Control application 122 performs operations associated with controlling the operation of system 100. The operations may be implemented using hardware, firmware, software, or any combination of these methods. With reference to the exemplary embodiment of FIG. 1, control application 122 is implemented in software stored in memory 120 and accessible by processor 108 for execution of the instructions that embody the operations of control application 122. Control application 122 may be written using one or more programming languages, assembly languages, scripting languages, etc. Control application 122 may include a plurality of modules that may be fully or partially integrated or execute independently.

By increasing the density of features on a DNA chip, the fabrication costs can be reduced and chip throughput increased. For example, a reduction imaging system decreasing the image size by a factor of two increases the density by a factor of four, while a factor of five image size reduction increases the density by a factor of twenty-five. Reduction optics assembly 104 controls the reduction in size of the features to increase the density of features on the DNA chip. With continuing reference to FIG. 2, in an exemplary embodiment, reduction optics assembly 104 decreases an image by a factor of five. Other reduction optics assemblies may be used that generate a higher, a lower, or the same reduction factor. Reduction optics assembly 104 may include an adjustable aperture 210, a first mirror 212, a second mirror 214, and an optical stop 216. Adjustable aperture 210 controls the filling of an entrance pupil of reduction optics assembly 104. Light array 211 enters through a hole in the center of first mirror 212. Light array 211 is reflected from second mirror 214 towards a front of first mirror 212. Light array 211 is reflected from first mirror 212 and focused onto a surface of target assembly 106. In an exemplary embodiment of system 100, the surface of target assembly 106 is a reaction surface of a DNA chip. To stop misdirected light or unwanted scattered light that enters reduction optics assembly 104 on-axis, optical stop 216, known as a "spider" among optical designers, is positioned between first mirror 212 and second mirror 214. First mirror 212 and second mirror 214 are aspheric in curvature to correct for aberrations and distortions. A large numerical aperture may be attained using a centered design, such that light array 211 is centered on the optical axis and passes through the hole in first mirror 212. In an exemplary embodiment, the resolution of reduction optics assembly 104 is greater than one micrometer (micron), to clearly resolve the 17×17 or the 13×13 micron pixels of an exemplary DLP. In other exemplary embodiments, a fewer or a greater number of mirrors may be used as known to those skilled in the art.

Light array 211 is received by reduction optics assembly 104 which demagnifies the image and provides a reduced image of the object array onto the surface of target assembly 106. The surface of target assembly 106 may comprise a surface of a substrate on which arrays of various oligonucleotides may be formed.

Figure 3:
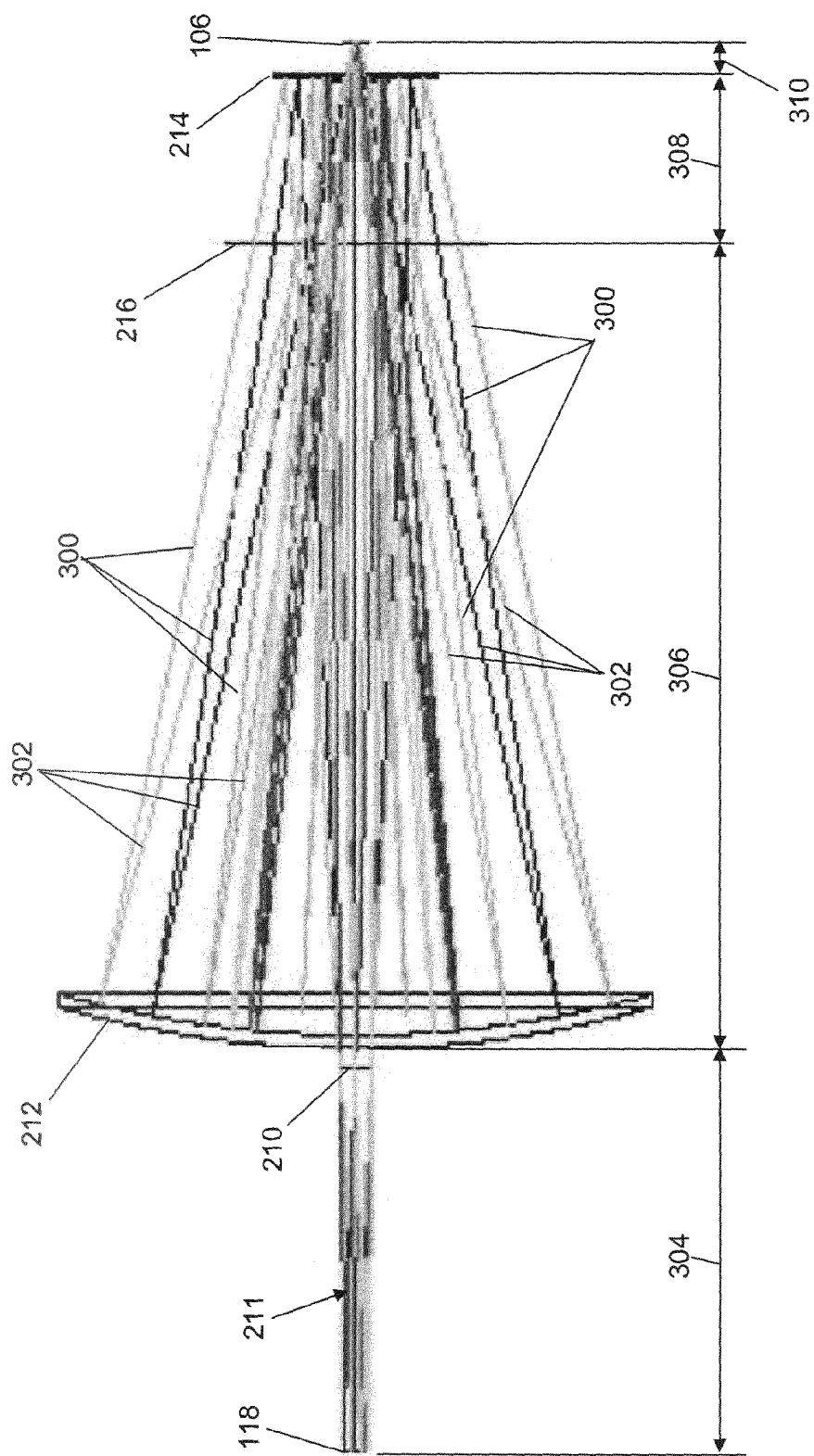
FIG. 3 is a simplified illustrative view of a reduction optics assembly included in the reflective optical assembly of FIG. 2 in accordance with an exemplary embodiment.

With reference to FIG. 3, reduction optics assembly 104 is shown in more detail. Light array 211 passes through the hole in first mirror 212 and strikes a front surface of second mirror 214. First reflected light 300 is reflected from the front surface of second mirror 214 towards first mirror 212. Second reflected light 302 is reflected from the front surface of first mirror 212 towards a hole in second mirror 214 so that second reflected light 302 strikes the surface of target assembly 106. Light modulator 118 is positioned on a center axis of reduction optics assembly 104. Light modulator 118 is positioned a first distance 304 from first mirror 212. Optical stop 216 is positioned a second distance 306 from first mirror 212. Second mirror 214 is positioned a third distance 308 from optical stop 216. The surface of target assembly 106 is positioned a fourth distance 310 from second mirror 214. In an exemplary embodiment, first distance 304 is approximately 180.5 millimeters (mm), second distance 306 is approximately 622 mm, third distance 308 is approximately 125 mm, and fourth distance 310 is approximately 30 mm.

Figure 4:
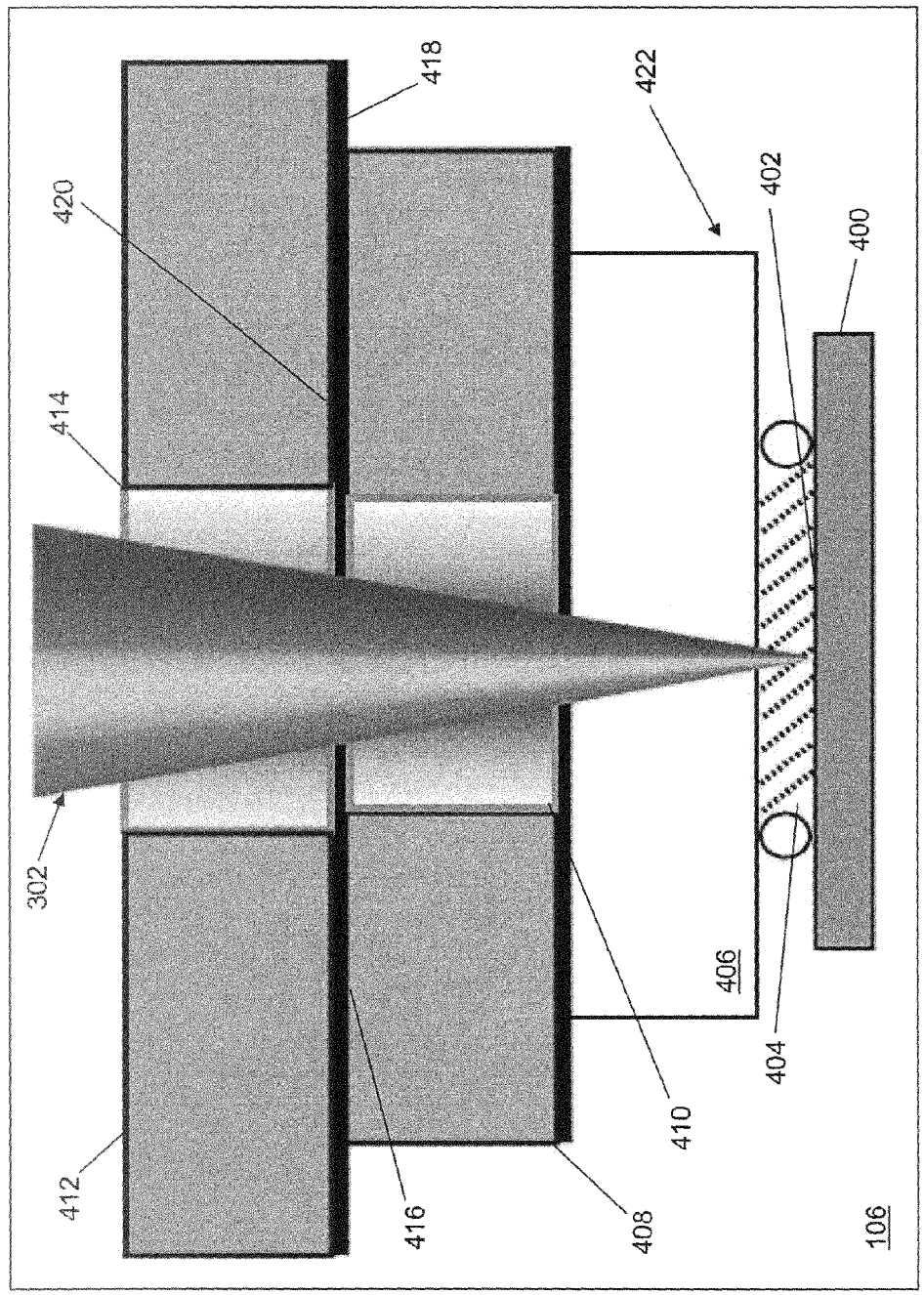
FIG. 4 is a simplified illustrative view of an illuminated assembly included in the system of FIG. 1 in accordance with an exemplary embodiment.

With reference to FIG. 4, target assembly 106 is shown in accordance with an exemplary embodiment. Target assembly 106 may include a reaction cell 422, a fine positioning stage 408, and a coarse positioning stage 412. Reaction cell 422 may include a substrate 400 including an exposed, active surface 402, a reaction chamber fluid cell 404, and a quartz block 406. In an exemplary embodiment, reaction cell 422 is connected to a DNA synthesizer. Reduction optics assembly 104 forms a demagnified image of the desired pattern on exposed, active surface 402 of substrate 400. Reaction chamber fluid cell 404 is positioned adjacent exposed, active surface 402 of substrate 400 and encloses a volume into which reagents can be provided through an input port and an output port (not shown) from fluid delivery system 110. Quartz block 406 positioned adjacent reaction chamber fluid cell 404 allows second reflected light 302 to be projected onto exposed, active surface 402.

Various approaches may be utilized in the fabrication of DNA probes on substrate 400 as known to those skilled in the art. With reference to FIG. 1, fluid delivery system 110 supplied with the requisite chemicals can be connected to reaction chamber fluid cell 404 to provide a desired sequence of chemicals under control of processor 108 executing control application 122. Quartz block 406 serves as a transparent backing for the reaction cell assembly. Reagents are delivered to reaction chamber fluid cell 404 where they are reacted upon irradiation by second reflected light 302.

With continuing reference to FIG. 4, target assembly 106 may include a two-level staging system that positions reaction cell 422 so that exposures can be positioned correctly and accurately. A first level includes fine positioning stage 408 and a second level includes coarse positioning stage 412. Coarse positioning stage 412 provides longer range movement in two directions in plane with the projected image. For example, coarse positioning stage 412 may provide approximately 2.5 centimeters (cm) of movement in each direction. Fine positioning stage 408 provides motion in three-directions at nanometer resolution. Fine positioning stage 408 and coarse positioning stage 412 are mounted to each other and together provide motion for the positioning and alignment of reaction cell 422. As used in this disclosure, the term "mount" includes join, unite, connect, associate, insert, hang, hold, affix, attach, fasten, bind, paste, secure, bolt, screw, rivet, solder, weld, and other like terms. Fine positioning stage 408 includes a first hole defined by a first hole peripheral edge 410 through which second reflected light 302 passes. Coarse positioning stage 412 includes a second hole defined by a second hole peripheral edge 414 through which second reflected light 302 passes.

In an exemplary embodiment, fine positioning stage 408 and coarse positioning stage 412 can be structurally fixed together using a mounting plate 418 positioned between a first surface 416 of fine positioning stage 408 and a second surface 420 of coarse positioning stage 412. Fine positioning stage 408 and coarse positioning stage 412 may be bolted together using mounting plate 418, and if needed, spacer plates can be included to adjust a spacing between fine positioning stage 408 and coarse positioning stage 412. Other mounting methods may be used without limitation. In the exemplary embodiment of FIG. 4, fine positioning stage 408 and coarse positioning stage 412 are mounted together in parallel so that the stages share the same orientation with the optical axis. Alternative arrangements and orientations may be used in alternative embodiments without limitation. When assembled, coarse positioning stage 412 is mounted to fine positioning stage 408, and fine positioning stage 408 is modified so that reaction cell 422 can be mounted to fine positioning stage 408. For example, an adapter plate may be used to mount reaction cell 422 to fine positioning stage 408 using a locking nut, a fitted slot, or any other mounting method. In another exemplary embodiment, a monolithic stage can be used to hold reaction cell 422 in position and to perform the step/scan operations. The monolithic stage may use air or magnetic bearings, flexural hinges, etc.

Coarse positioning stage 412 may be controlled by high-resolution servo motors or stepper motors, which have minimal crosstalk with fine positioning stage 408. For example, a high resolution servo motor controls movement with less than approximately one micron positional error. Such motors may be found in high-precision microscope stages. Fine positioning stage 408 may be actuated by peizo actuators which enable precise motion in three orthogonal axes, x, y, and z. For example, control in x- and y-directions may control movement in plane with the projected image to control overlay of subsequent exposures. Control in a z-direction is along the optical axis to enable focal positional control. Fine positioning stage 408 may control movement with less than approximately 100 nm positional error.

The number of positional and alignment steps provided by the staging system is defined by $4 \times N \times q^2$, where N is a number of oligomer units to be synthesized and q is the number of fields, where a field constitutes a whole area of light modulator 118 provided at the image plane. The factor of four arises due to each cycle of a DNA base (i.e. ACGT) that requires an alignment step for overlay. The squared term arises because each field includes movement from field to field in addition to alignment within a field. For example, for a 25-field (q) chip where each spot synthesized is 60 nucleotides long (N) a minimum of $4 \times 60 \times 25^2 = 150,000$ movements of the staging system is required. An external feedback mechanism may monitor a position of exposed, active surface 402 using alignment marks patterned on exposed, active surface 402 using standard "lift-off"0 processing, where chromium is accurately patterned on exposed, active surface 402. Feedback information about the position may be provided by camera 112 which observes the image plane/synthesis plane using an on-axis beam-splitter or rear projection from behind the reaction cell.

Camera 112 may be a charge coupled device camera used to capture an image of alignment marks. The captured image may be sent to processor 108 for image processing. When a misalignment is detected, correction signals are generated by control application 122 executed by processor 108. The correction signals may be sent to actuators associated with fine positioning stage 408 and/or coarse positioning stage 412 depending on the detected misalignment as the feedback to adjust the position of substrate 400 so that the correct alignment is reestablished. Exemplary actuators include an electric motor, a servo, stepper, or piezo motor, a pneumatic actuator, a gas motor, or the like.

Figure 5:
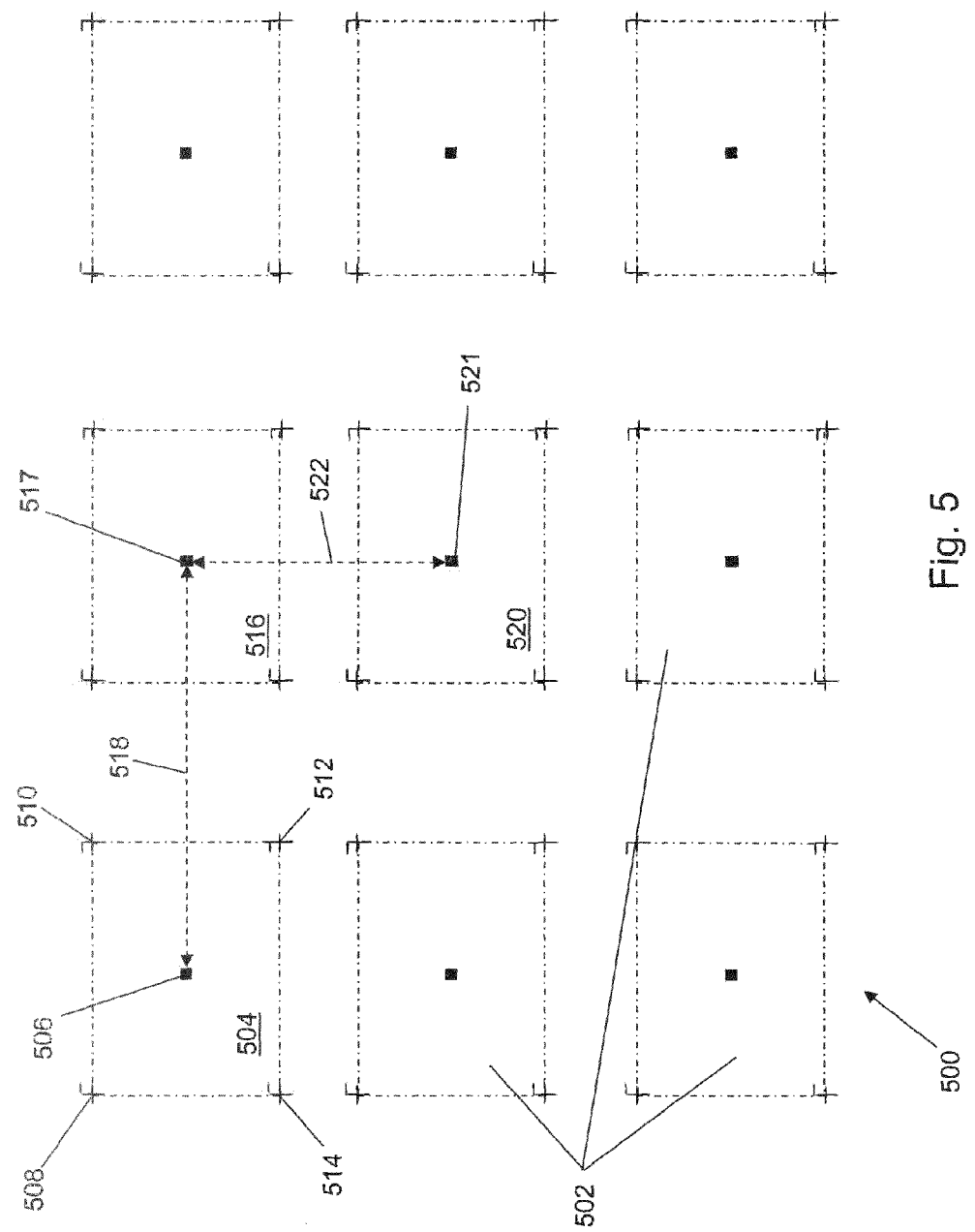
FIG. 5 illustrates an alignment marking pattern in accordance with an exemplary embodiment.

With reference to FIG. 5, exemplary alignment marks are shown in accordance with an exemplary embodiment. In the exemplary embodiment of FIG. 5, a 3×3 array 500 of alignment marks are shown which are evenly spaced about an area of synthesis. The array of alignment marks include synthesis regions 502 notionally indicated by the dashed lines. It should be understood that the dashed lines in FIG. 5 are not actually patterned on exposed, active surface 402 but are for visual reference only. Such an arrangement can be scaled to a different dimension array.

Each of the synthesis regions 502, in the exemplary embodiment of FIG. 5, are defined by a center alignment mark and four corner alignment marks. For example, a first synthesis region 504 of the synthesis regions 502 includes a first center alignment mark 506, a first corner alignment mark 508, a second corner alignment mark 510, a third corner alignment mark 512, and a fourth corner alignment mark 514. Center alignment mark 506, first corner alignment mark 508, second corner alignment mark 510, third corner alignment mark 512, and fourth corner alignment mark 514 are patterned on the surface of substrate 400 so that the surface of substrate 400 can be monitored throughout synthesis. In an exemplary embodiment substrate 400 has dimensions of 25.1 mm×75.86 mm. A reaction cell array may be bounded by a gasket area having a width of 2.85 mm.

The choice of alignment marks or patterns can vary. Various mark shapes such as crosses, chevrons, circles, square, etc. can be used as the alignment marks. For example, center alignment mark 506 may include a 20×20 micron square. First corner alignment mark 508, second corner alignment mark 510, third corner alignment mark 512, and fourth corner alignment mark 514 may be fiducials or fixed points or lines that aid in the location of chip areas during the data extraction process (microscopy). In the exemplary embodiment of FIG. 5, first corner alignment mark 508, second corner alignment mark 510, third corner alignment mark 512, and fourth corner alignment mark 514 crossed lines having a length of 5-10 microns and a thickness of 2.75 microns. First corner alignment mark 508, second corner alignment mark 510, third corner alignment mark 512, and fourth corner alignment mark 514 may define corners of a square of 2 mm by 2 mm centered around first center alignment mark 506. An accurate alignment mark may follow a pixel spacing of light modulator 118 and are kept within a registry area of light modulator 118. In an exemplary embodiment, first center alignment mark 506 is separated a first distance 518 from a second center alignment mark 517 of a second synthesis region 516. Second center alignment mark 517 is separated a second distance 522 from a third center alignment mark 521 of a third synthesis region 520. In an exemplary embodiment, first distance 518 is five mm and second distance 522 is 4.3 mm.

A two-dimensional optical pattern recognition technique based on correlation theory may be used to interpret the images of the alignment marks of synthesis regions 502. Correlation analysis compares two signals (or images) to determine a degree of similarity. Each correlation gives a peak value where the reference signal and input signal match the best. If the location of this value is different from a previous value or a next desired positional value, the image has shifted, indicating a need for correction. In an exemplary embodiment, an image processing procedure of control application 122 calculates an image displacement from the images captured by camera 112 by calculating cross-correlation signals between a captured input image and a desired image as known to those skilled in the art. Correction or movement signals are computed and sent to the actuators to move fine positioning stage 408 and/or coarse positioning stage 412 depending on the synthesis process being executed.

Reagent flows over exposed, active surface 402 after each light exposure. Processor 108 executing control application 122 controls the exposure, the timing of the cycles, the reagent delivery, the pattern formed by light array 211, and the correction or movement signals sent to the actuators to move fine positioning stage 408 and/or coarse positioning stage 412. In an exemplary embodiment, exposed, active surface 402 is exposed by a step-and-repeat process, whereby the image created by reduction optics 104 is stepped to different locations to create the desired array size such as 3×3 or 5×5.

The word "exemplary" is used herein to mean serving as an example, instance, or illustration. Any aspect or design described herein as "exemplary" is not necessarily to be construed as preferred or advantageous over other aspects or designs. Further, for the purposes of this disclosure and unless otherwise specified, "a" or "an" means "one or more".

Aspects of the exemplary embodiments may be implemented as a method, apparatus, or article of manufacture using standard programming and/or engineering techniques to produce software, firmware, hardware, or any combination thereof to control a computer to implement the disclosed embodiments. The term "computer readable medium" can include, but is not limited to, magnetic storage devices (e.g., hard disk, floppy disk, magnetic strips, . . . ), optical disks (e.g., compact disk (CD), digital versatile disk (DVD), . . . ), smart cards, flash memory devices, etc. Additionally, it should be appreciated that a carrier wave can be employed to carry computer-readable media such as those used in transmitting and receiving electronic mail or in accessing a network such as the Internet or a local area network (LAN). The network access may be wired or wireless.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A device comprising:
   a reduction optics assembly configured to receive a light array of selectable regions of light and dark areas, to reduce a size of the light array in two-dimensions, and to project a pattern of the light array reduced in size on a target surface; and
   a target assembly, the target assembly comprising
   a first stage mounted between the target surface and the reduction optics assembly, the first stage comprising a first peripheral edge forming a first hole through the first stage through which the pattern is projected onto the target surface;
   a first motor connected to control movement of the first stage to move the target surface in at least two directions in plane with the projected pattern with a first precision;
   a second stage mounted between the target surface and the reduction optics assembly and further mounted to the first stage so that the first stage and the second stage do not move relative to each other, the second stage comprising a second peripheral edge forming a second hole through the second stage through which the pattern is projected onto the target surface; and
   a second motor connected to control movement of the second stage to move the target surface in the at least two directions in plane with the projected pattern with a second precision that is smaller than the first precision.

2. The device of claim 1, further comprising a light emitting object array configured to form the light array of selectable regions of light and dark areas.

3. The device of claim 1, further comprising the target surface wherein the target surface is an active surface on which a microarray is formed.

4. The device of claim 3, wherein the microarray is a deoxyribonucleic acid (DNA) microarray.

5. The device of claim 4, further comprising a fluid cell enclosing the active surface and including ports for applying DNA synthesis reagents into the fluid cell for flowing over the active surface.

6. The device of claim 5, further comprising a processor and a computer-readable medium operably coupled to the processor, wherein the computer-readable medium includes instructions stored thereon that, when executed by the processor, control movement of the first stage and the second stage in synchronization with the application of the DNA synthesis reagents and selection of the selectable regions of light and dark areas.

7. The device of claim 6, further comprising a camera positioned below the target surface and opposite the second stage to capture an image of alignment marks placed on the target assembly to align the target surface with the reduction optics assembly.

8. The device of claim 1, wherein the second stage is configured to move the target surface in a third direction that is orthogonal to the at least two directions in plane with the projected pattern to enable focal positional control.

9. The device of claim 1, wherein the first stage is configured to move the target surface to form a plurality of synthesis regions that each receive the projected pattern.

10. The device of claim 9, wherein the second stage is configured to move the target surface within a synthesis region of the plurality of synthesis regions.

11. The device of claim 2, wherein the reduction optics assembly comprises:
a first aspheric mirror facing the target surface; and
a second aspheric mirror facing the first aspheric mirror;
wherein the second aspheric mirror is configured to receive the light array from the light emitting object array and to reflect the received light array toward the first aspheric mirror, and the first aspheric mirror is configured to receive the reflected light array and to reflect the received reflected light array toward the target surface.

12. The device of claim 11, wherein the reduction optics assembly further comprises an adjustable aperture positioned between the first aspheric mirror and the light emitting object array to control the filling of an entrance pupil of the reduction optics assembly.

13. The device of claim 12, wherein the reduction optics assembly further comprises an optical stop positioned between the first aspheric mirror and the second aspheric mirror to stop unwanted light from entering the reduction optics assembly on-axis.

* * * * *